United States Patent [19]

Lim et al.

[11] Patent Number: 5,002,903

[45] Date of Patent: Mar. 26, 1991

[54] PORCELAIN ENAMELED METAL SUBSTRATES

[75] Inventors: Chung Lim, Middleburg Hts.; William D. Faust, Aurora, both of Ohio

[73] Assignee: Ferro Corporation, Cleveland, Ohio

[21] Appl. No.: 278,959

[22] Filed: Dec. 1, 1988

[51] Int. Cl.[5] .......................... C03C 8/16; C03C 8/04; C03C 3/066

[52] U.S. Cl. .......................... 501/26; 501/5; 501/10; 501/20; 501/79

[58] Field of Search .................. 501/5, 10, 20, 26, 79

[56] References Cited

U.S. PATENT DOCUMENTS

| | | | |
|---|---|---|---|
| 2,757,220 | 7/1956 | Carter | 136/233 |
| 3,458,344 | 7/1969 | Little et al. | 428/433 |
| 3,935,088 | 1/1976 | Kaup et al. | 204/181 |
| 3,962,490 | 6/1976 | Ward | 427/193 |
| 4,085,021 | 4/1978 | van der Vliet | 204/181 |
| 4,172,733 | 10/1979 | Moritsu et al. | 106/1.15 |
| 4,256,796 | 3/1981 | Hang et al. | 428/210 |
| 4,358,541 | 11/1982 | Andrus et al. | 501/5 |
| 4,361,654 | 11/1982 | Ohmura | 501/26 |
| 4,385,127 | 5/1983 | Chyung | 501/5 |
| 4,654,095 | 3/1987 | Steinberg | 156/89 |

OTHER PUBLICATIONS

Hughes et al., (I), "Porcelain Enamel Substrates", Reprinted from the International Enamelist, Dana Chase Publications, Inc., May 1981.

Hughes et al., (II), "Properties of Porcelain Enameled Metal Core Substrates", Presented at Nepcon West, Anaheim, Calf., Feb. 23, 1982.

Onyshkevych, "Porcelain-Enameled Steel Substrates for Electronic Applications", An Appliance Reprint, Dana Chase Publications, Inc., Apr. 1981.

Sinnadurai, "Men, Methods and Machines in Microelectronics Packaging and Interconnection", Hybrid Circuits, No. 13, May 13, 1987.

Schabacker, "The Multiplicity of Variations in PEMS", Presented at the Interconnection, Hybrid Circuits, No. 13, May 13, 1987.

Andrews, *Porcelain Enamels*, Second Edition 1961, pp. 276-278.

Ceramic Industry Magazine, Jan. 1972, p. 86.

*Primary Examiner*—Mark L. Bell
*Attorney, Agent, or Firm*—Renner, Otto, Boisselle & Sklar

[57] ABSTRACT

The present invention contemplates a novel enamel composition, a novel electrodeposition bath, a novel metal substrate for enameling, and the novel PEMS produced from these materials and procedures. In general, the novel glass composition of the present invention are within the following composition ranges (which are set forth in percent by weight).

| | |
|---|---|
| $SiO_2$ | 9-16% |
| $B_2O_3$ | 20-25% |
| $MoO_3$ | 2-10% |
| $MgO$ | 30-40% |
| $BaO$ | 16-22% |
| $ZnO$ | 5-14% |
| $SnO_2$ | 0-4% |

In the novel application method of the present invention, an improved electrophoretic bath has been found in which the glass particles are suspended in a mixture of isopropyl alcohol and either dichloromethane or trichlorotrifluoroethane together with ethylene glycol and an acrylic additive. Stainless steel electroplated with a thin film of molybdenum and heat-treated at an elevated temperature is employed as the substrate.

12 Claims, No Drawings

PORCELAIN ENAMELED METAL SUBSTRATES

The present invention relates to porcelain enameled metal substrates ("PEMS") and more particularly to novel porcelain enamel compositions for preparing PEMS, as well as novel methods of preparing metal substrates for application of an enamel coating and novel baths and techniques for applying such enamel coatings.

BACKGROUND OF THE INVENTION

The use of PEMS as a base upon which to fabricate electronic circuitry is well known in the art. The early PEMS comprised a conventional porcelain enamel glass applied to a metal substrate, typically a low carbon steel substrate, which was fired causing the glass to fuse and flow and form a glass film bonded to the metal substrate by various chemical and mechanical mechanisms. On cooling to room temperature, the resulting porcelain enameled metal substrate was found to be useful for fabricating a variety of electronic elements, so long as the subsequent steps in the fabrication of the electronic component did not require reheating of the PEMS to a temperature higher than the softening temperature of the glass, usually between 550° and 650° C. This temperature limitation prohibited the use of PEMS in the fabrication of high reliability hybrid circuit boards where the printed circuits were desired to be cured at temperatures as high as 850° C.

In preparing such PEMS from porcelain enamel glass compositions, the glass was typically prepared from a mixture of precursor oxides which were smelted at a temperature of about 1200° to about 1500° C. for about 30 to about 60 minutes, then roll quenched to provide a frit which was ground in water to an average particle size of about 10 to about 25 microns. The porcelain enamel overcoat was then applied to the metal substrate by a number of different techniques, but usually by electrophoresis from a water based bath, after which the enamel was dried and fired typically at a temperature of about 760° to about 880° C.

As noted earlier, in order to achieve stability and reliability of printed hybrid circuit boards, refiring temperatures as high as 850° C. or higher are preferred. Since conventional porcelain enamel compositions could not function under such parameters, the use of crystallizing glass compositions were developed. Crystallizing glass compositions, or devitrified glass compositions, behave quite differently from conventional porcelain enamel glass compositions when fired.

The conventional glass enamel, when applied to the metal substrates and fired, are fused with increasing temperature to flow and form a glass film upon the metal substrate. The crystallizing porcelain enamel coatings on the other hand have a normal firing temperature of about 800° to 900° C. to form a good enamel film, but subsequently crystallize to drastically increase the viscosity of the coating. The crystallized coating will then behave similar to the crystalline materials and retain their rigidity even if refired to the same high firing temperatures. Such materials, for example, are taught in U.S. Pat. No. 4,256,796 to Hang et al., U.S. Pat. No. 4,358,541 to Andrus et al., U.S. Pat. No. 4,385,127 to Chyung, and also in Japanese Patent Publication No. 85/172 102, dated Sept. 5, 1985. These glass ceramic systems generally rely on the recrystallization of $BaO.2MO.2SiO_2$, $2MO.B_2O_3$, $2MO.SiO_2$, and $MO.SiO_2$ crystals from the mother glass based on the various oxide compositions of BaO, $SiO_2$, $B_2O_3$, and MO, where MO stands for MgO, CaO, or ZnO.

The use of recrystallizing glass ceramic coatings has overcome the softening problems encountered with conventional glass enamel compositions, however, problems have been encountered with lack of adhesion of the glass ceramic coating to the metal substrate. In particular with low carbon steel substrates, it has been noted that the enamel cracks on the edges of the substrate, more particularly on the corners, especially after being refired repeatedly at high temperatures. This failure is due in part to the poor adhesion of glass ceramic coating to the metal. However, the main cause of the enamel cracks is due to too high a thermal expansion of the core metal compared to that of the coating material. The volume change accompanied by the ferrite-to-austenite phase transformation in low carbon steel taking place around 870° C., is still another factor causing the enamel cracks if fired above this temperature.

The low carbon steel substrates were also found to have a tendency to warp when fired repeatedly at temperatures in excess of 850° C. Extended exposure to elevated temperatures can cause the grain growth of low carbon steel structures and the coarse grain crystal structures adversely affect the physical strength of substrates. The volume change associated with the phase transformation can further distort the low carbon steel substrate.

Nevertheless, at present, the most popular substrate for enamel coating is still low carbon steel. Typically where low carbon steels are employed as the metal substrate, they are subjected to acid pickling and deposition of a thin nickel coating prior to the electrophoretic application of the porcelain enamel coating. Such techniques, however, have limited efficacy in the case of alloy metal substrates such as stainless steel which are chemically and electrochemically rather inert, so that little or no reaction takes place in the acids and/or the nickel sulfate solution. Until now, where stainless steel was to be employed as the metal substrate for fabrication of a PEMS the stainless steel was either etched and/or sandblasted. While sandblasting is generally considered the state of the art method, it is expensive and often deforms or warps the light gauge sheet steels commonly used as substrates for enameling. In addition, sand particles can become imbedded in the steel surface and cause enamel defects.

U.S. Pat. No. 3,962,490 to Ward teaches a method of applying an enamel coating to a stainless steel substrate in which the stainless steel workpiece is first dipped into an aqueous solution of a molybdenum salt, then heated to thermally decompose the molybdenum compound prior to enameling. This worked fine for some applications, but it did not provide an even coating of molybdenum, and was not suitable for PEMS being prepared for use in fabricating sophisticated electronic components.

The application of porcelain enamel coating on to the metal substrates can be done in various ways, however, electrophoretic deposition technique is most preferred for the manufacture of PEMS. Early PEMS were prepared by electrophoretically depositing the enamel from a water slurry. The chemistry of crystallizing glass ceramic coatings, however, generally requires a non-aqueous suspension such as alcohols.

The preparation of a suspension with the optimum properties may require experimentation with the composition, concentration, and dispersing procedure.

Polar compounds such as alcohols, nitroparaffins, and mixtures of these can be employed. Slightly polar organic compounds, such as diethylene glycol, dimethyl ether, and pyridine may also be employed. A great number of suspension formulations can be made from these various organic suspension vehicles, but no single generalized formulation can be defined.

It is therefore one object of the present invention to provide a novel crystallizing porcelain enamel composition for use in coating metal substrates.

It is another object of the present invention to provide a novel deposition bath for electrophoretically applying crystallizing porcelain enamel coatings to a metal substrate.

It is yet a further object of the present invention to provide improved porcelain enameled metal substrates for use in fabrication of electronic circuitry.

It is a still further object of the invention to provide a novel method of treating steel substrates to enhance the adhesion of the fired porcelain enamel coating to the metal substrates, specifically electrochemically rather inert alloy steels such as stainless steels.

SUMMARY OF THE INVENTION

The novel enamel compositions of the present invention are prepared by adding from about 2 to about 10 weight percent molybdenum oxide to recrystallizing glass compositions of the type discussed hereinbefore. The addition of molybdenum oxide appears to provide a threefold advantage, since it appears to reduce the surface tension of the glass and thus improve the flowing property of the enamel in the initial firing stage; it improves the opacity of the coating, and, perhaps most importantly, it appears to substantially improve the bonding of the enamel coating to the substrate. A small amount of tin oxide may also be added if a shiny surface appearance is desired.

In general, the novel glass composition of the present invention are within the following composition ranges (which are set forth in percent by weight).

TABLE I

| | |
|---|---|
| $SiO_2$ | 9–16% |
| $B_2O_3$ | 20–25% |
| $MoO_3$ | 2–10% |
| MgO | 30–40% |
| BaO | 16–22% |
| ZnO | 5–14% |
| $SnO_2$ | 0–4% |

There are a number of possible advantages to using a stainless steel, specifically a 400-series stainless steel, as the substrate, including a better potential match between the thermal coefficient of expansion of the substrate and that of the enamel coating. In the novel method of the present invention, a thin film of molybdenum is electroplated onto the stainless steel substrate and fired in air at an elevated temperature of, for example, 880° C. for 10 minutes, and this provides substantial improvement in the adhesion between the stainless steel substrate and subsequently applied enamel coating.

As noted before, early PEMS were prepared by electrophoretically depositing the enamel from a water slurry. The recrystallizing enamel compositions are typically subject to hydration if they come into contact with water. For this reason, while they are still electrophoretically deposited, it is from a nonaqueous solvent, typically an isopropyl alcohol suspension. In the novel application method of the present invention, an improved electrophoresis bath has been found, in which the glass particles are suspended in either trichlorotrifluoroethane or dichloromethane containing about 10 to 40 volume percent of isopropyl alcohol. These baths also contain acrylic additive together with ethylene glycol.

The first step in preparing porcelain enamels for the manufacture of PEMS, including those of the present invention, is to prepare a glass frit having the desired composition. This is accomplished using techniques well known to those skilled in the art by admixing the specific raw materials and then heating the mixture to the melting temperature being employed in the glass making process. Particular attention should be paid to the exclusion of alkali metal impurities such as sodium oxide which can have a marked adverse effect on the electric properties of the porcelain.

The raw materials are weighed out in any suitable batch size from laboratory size to commercial scale and are blended together. The mixture is then heated to a temperature of about 1350° to about 1500° C., and the resultant molten mass is maintained at this temperature for about 30 minutes to about 1 hour. A platinum crucible or the like should be used because of the highly corrosive nature of the present glass compositions.

The molten glass is then converted into a glass frit. Again, this step is not per se critical and any of the various techniques well known to those skilled in the art can be employed. In the practice of the present invention, the molten stream of glass has been poured over a set of revolving water cooled rollers to produce a thin ribbon of solidified glass.

The solidified glass ribbon is then crushed and resulting flakes are placed in a ball mill and milled to a slurry using a non-aqueous organic solvent as the medium, such as, for example, isopropyl alcohol.

About 500 ml of the organic solvent is added to the 1 kg of glass flakes which is milled for a period sufficient to reduce the particle size of the glass to a range of from about 1 to about 10 microns. This generally takes anywhere from about 12 to about 20 hours, depending on the specific equipment employed and the size of the batch. After grinding, the slurry is removed from the ball mill and stored as wet slurry or dried to powder for the future preparation of the electrophoretic deposition bath in which the glass is applied to the metal substrate.

The foregoing glass is particularly suitable for the fabrication of electronic circuit boards and for coating electrical components, especially for those applications which require a high degree of performance and reliability under adverse conditions, such as where they are subjected to particularly high temperatures, i.e. 700° to 900° C. during subsequent fabrication and manufacturing steps.

In general, the manufacture of PEMS using the porcelain enamel of the present invention is also similar to known procedures and techniques. A metal core or substrate is initially prepared for porcelain enameling, the core generally being chosen from a variety of metals and metal alloys including stainless steel and low carbon steels. The metal substrate is stamped or laser cut into the desired configuration and any required apertures, mounting holes or the like are formed in the metal core by conventional metal working techniques. Prior to application of the porcelain enamel, it is desirable to remove all burrs, sharp edges, imperfections or the like from the metal to facilitate the subsequent application of a uniform coating of porcelain enamel.

Typically, where low carbon steel metal cores are employed, they are degreased and rinsed, then etched, typically with a sulfuric acid. The substrate was then usually given a flash of metal such as nickel or cobalt to assist in the adhesion of the porcelain to the metal.

The low carbon steel metal cores have been successfully used for the manufacture of conventional PEMS. However, as described earlier, a number of problems such as poor adhesion of coating to the metal, enamel cracks on edges and corners, and warpings have been encountered frequently with the high temperature glass ceramic coatings applied onto the low carbon steel substrates. The low carbon steel is seemingly unable to provide the property requirements needed by the glass ceramic coatings where the extended exposures at the elevated temperatures in excess of 850° C. are required.

The 400 series stainless steels have been found to possess the adequate thermal expansion and heat resisting properties required for the present application. In particular, 409 stainless steel was preferred having added advantages of cost and commercial availability. Lack of enamel to metal bonding has been a major difficulty with stainless steel type substrates heretofore used for porcelain enamel coating application. A novel process has been used in the present invention which provides improved enamel to metal bonding and overcomes prior problems.

The novel treatment process of the present invention comprises electroplating of a molybdenum film onto the stainless steel substrate using a 5 weight percent ammonium heptamolybdate tetrahydrate solution, with subsequent firing of the dried substrate in air at temperatures ranging from 800° C. to 980° C. for 5 to 30 minutes or longer. The prepared metal core is then coated with a porcelain enamel, preferably by electrophoretic deposition from a non-aqueous bath, i.e., preferably, one of the novel bath compositions provided in Table V hereinafter.

Excellent bonding of glass ceramic coating to the metal core was observed when the molybdenum plated and heat treated stainless steel substrates were electrophoretically coated with the glass ceramic compositions of the present invention and subsequently fired. The bonding characteristics were tested by the standard drop weight impact method well known in the porcelain enamel industries.

Typically, in electrophoretic deposition, the organic suspension is prepared according to the desired bath composition that includes solid concentration, type and amount of vehicles, and other additives if needed. The suspension medium most widely and commonly referred to and taught in the prior art such as U.S. Pat. No. 4,256,796, is isopropyl alcohol. Various experiments with the 100% isopropyl alcohol bath showed that further improvement was necessary for the satisfactory deposition of the porcelain enamel compositions of the present invention. In some early tests, problems such as sagging, dripping, beading, heavy edge coating, and drain marks were encountered.

The novel bath composition of the present invention is a mixture of 10 to 40 volume percent of isopropyl alcohol and 60 to 90 volume percent of either trichlorotrifluoroethane or dichloromethane together with 0 to 10 volume percent of ethylene glycol and 0 to 5 volume percent of an acrylic polymer solution. About 5 to 30 weight percent of dried enamel powder is added to the bath and stirred continuously to keep the particles in suspension. This deposition bath composition minimizes the problems encountered with the straight isopropyl alcohol bath, and a satisfactory enamel deposit with a uniform coating thickness can reproducibly be obtained.

Stainless steel sheets are typically employed as the two anodes being separated by about 2 inches. The metal part to be coated is placed between the anodes in the cathode position. A DC potential of 200 to 1000 volts is applied across the electrodes through the bath in a conventional manner and the glass particles in suspension deposit on the surface of the metal part. The coating thickness is a function of the deposition voltage and time being employed. When the desired thickness of glass particles has been deposited on the metal core, the part is removed from the bath and excess solvents are allowed to drain.

The coated substrates require no special drying, but preferably should be placed in a vented hood to avoid problems with regard to solvent vapors in the general working area. The coated substrate can be fired in about 15 minutes as the solvents evaporate rapidly.

The article can be fired in any conventional manner, preferably using either a box furnace or a continuous furnace, techniques commonly used in the porcelain enamel industries. The optimum firing schedule for the glass compositions of the present invention is 5 to 10 minutes at a temperature around 870° C. The enamel coating undergoes a rapid change as it is fired. In the case of a box firing, the glass particles begin to fuse with time, and a shiny glassy surface is observed in about 1 to 2 minutes. The coating immediately turns to a dull matte like appearance, resulting from the rapid devitrification of the enamel coating. Several additional minutes are needed for the completion of desired crystallization process.

The glass compositions of the present invention can still form a glassy film even if fired at a temperature as low as 720° C. However, the coatings are very fragile and have nearly no adhesion. At least 10 minutes firing at 820° C. is generally required to obtain a devitrification visually similar in appearance to a sample fired at 870° C. for 5 minutes.

In the case of a continuous chain furnace firing, the enamel coating appears to fuse gradually as it passes through the preheating zone, forming a good glass film in the hot zone, and then subsequently crystallizing. The very slow crystallization rate at lower temperatures and the rapid crystallization rate at higher temperatures as described above for the present glass compositions, therefore, suggests use of the box furnace for the small quantity work, and the use of continuous chain furnace for the large scale production, with nearly identical results from both types of firings.

By following the foregoing firing procedures, there is sufficient initial flow for leveling but essentially no extensive flow of the material on the surface. As a result of the rapid increase in viscosity, there is no substantial change in the uniformity of the thickness of the coating on the metal core. The finished fired porcelain will have the same relative uniform thickness layer on the surface, and, using the novel porcelain enamel of the present invention, also around the holes and on the edges.

The fired porcelain enamel has been estimated to contain more than 90 volume percent of crystalline material with the remainder of the composition being comprised of vitreous glass. The proportion of the crystal material and vitreous glass is dependent upon both the composition of the frit employed and to some extent of the firing conditions utilized. In the compositions of the present invention, four types of crystalline phases have been confirmed to be present by x-ray diffraction analyses, namely $2MgO.B_2O_3$, $BaO.2MgO\ 2SiO_2$, $BaO.2ZnO.2SiO_2$, and $BaO.MoO_3$. The amount of $BaO.MoO_3$ crystals present in the fired enamel increases nearly in proportion to the $MoO_3$ content according to the x-ray analyses.

PREFERRED EMBODIMENT

The preferred enamel compositions of the present invention fall within the oxide ranges set forth in Table II.

TABLE II

| | |
|---|---|
| $SiO_2$ | 11.0–15.0% |
| $B_2O_3$ | 21.0–24.0% |
| $MoO_3$ | 2.0–8.0% |
| MgO | 30.0–36.0% |
| BaO | 16.0–22.0% |
| ZnO | 6.0–12.0% |
| $SnO_2$ | 0–4.0% |

EXAMPLES 1–8

A series of specific glass compositions were prepared as described hereinafter having the oxide compositions set forth in Table III.

TABLE III

EXAMPLES OF GLASS COMPOSITIONS

| | #1 | #2 | #3 | #4 |
|---|---|---|---|---|
| BaO | 17.89 | 17.55 | 16.90 | 18.13 |
| MgO | 32.62 | 32.02 | 30.83 | 33.65 |
| ZnO | 10.59 | 10.38 | 10.00 | 10.38 |
| $SiO_2$ | 14.02 | 13.75 | 13.24 | 11.54 |
| $B_2O_3$ | 22.87 | 22.45 | 21.62 | 22.45 |
| $MoO_3$ | 2.01 | 3.85 | 7.41 | 3.85 |
| Total | 100 | 100 | 100 | 100 |

| | #5 | #6 | #7 |
|---|---|---|---|
| BaO | 21.00 | 18.01 | 21.00 |
| MgO | 33.00 | 33.14 | 33.00 |
| ZnO | 7.00 | 10.48 | 7.00 |
| $SiO_2$ | 12.00 | 12.78 | 12.00 |
| $B_2O_3$ | 23.00 | 22.66 | 23.00 |
| $MoO_3$ | 4.00 | 2.93 | 3.60 |
| $SnO_2$ | — | — | 0.40 |
| Total | 100 | 100 | 100 |

Batch compositions of raw materials were then calculated based on the oxide compositions. An example is given in Table IV for the glass composition No. 5 in Table III.

TABLE IV

BATCH COMPOSITIONS

| | |
|---|---|
| Barium Carbonate, $BaCO_3$ | 654.4 grams |
| Calcined Magnesia, MgO | 829.2 grams |
| Zinc Oxide, ZnO | 168.0 grams |
| Quartz Powder, $SiO_2$ | 288.0 grams |
| Anhydrous Boric Acid, $B_2O_3$ | 560.4 grams |
| Molybdenum Trioxide, $MoO_3$ | 96.0 grams |
| TOTAL | 2596.0 grams |

As noted, the corrosive nature of glass compositions of the present invention does not permit ordinary refractory crucibles to be used for smelting. The glass should be smelted in a platinum crucible preferably at 1450° C. for 30 to 60 minutes. The glass melt has good flowing properties at this temperature and can be roll-quenched readily.

The glass frits were milled in an isopropyl alcohol medium for 16 hours to an average fineness of 5 microns. The milled slip was then dried and stored for the preparation of electrodeposition bath.

Dilatometric analyses show no softening of enamel even at temperatures above 900° C. The thermal expansion coefficient and glass softening temperature obtained from the dilatometric measurements are shown in Table V. In the dilatometric measurements, test samples received a heat treatment similar to the initial enamel firing so that the test results would represent properties as close to the initially fired enamel coatings as possible.

TABLE V

Thermal Expansion Coefficients (in/in/°C.) and Dilatometric Softening Temperatures (°C.) of Example Glasses

| | Ther. Exp. (25–500° C.) | Softening Pt.(°C.) | | Ther. Exp. (25–500° C.) | Softening Pt.(°C.) |
|---|---|---|---|---|---|
| #1 | $109.2 \times 10^{-7}$ | >930 | #5 | $115.8 \times 10^{-7}$ | 930 |
| #2 | 109.4 | >930 | #6 | 117.8 | >930 |
| #3 | 106.4 | >930 | #7 | 115.8 | 930 |
| #4 | 116.2 | >930 | | | |

Because deposition equipment and conditions vary widely, the preparation of a suspension with the optimum properties may require experimentation with the composition, concentration, and dispersing procedure.

The novel bath compositions of the present invention embrace a number of specific combinations of solvents. The vehicle systems given in Table VI yielded particularly satisfactory deposition results in both laboratory beaker and moderately scaled-up deposition baths.

TABLE VI

| BATH COMPOSITION #1 | | BATH COMPOSITION #2 | |
|---|---|---|---|
| Glass Solids (Ave. 5 Microns)[1] | 100 gm | Glass Solids (Ave. 5 Microns)[1] | 100 gm |
| Isopropyl Alcohol | 200 ml | Isopropyl Alcohol | 100 ml |
| Dichloromethane | 400 ml | Trichlorotrifluoroethane | 500 ml |
| Ethylene Glycol | 4 ml | Ethylene Glycol | 8 ml |
| Acrylic Binder[2] | 2 ml | Acrylic Binder[2] | 1 ml |
| Deposition Voltage | 800 VDC | Deposition Voltage | 800 VDC |
| Deposition Time | 30 sec | Deposition Time | 30 sec |
| Deposit on | Cathode | Deposit on | Cathode |

[1]Milled in isopropyl alcohol for 16 hours.
[2]Acrylic binder was made from 137.33 gm of Acryloid 87 in MEK, 10.3 gm of Butyl-benzyl phthalate and 215 gm of Trichloroethane.

The above bath compositions are considered optimum, and therefore generally to be preferred, but a widely varied composition range (at least ±50% change) still yielded very satisfactory results. Deposition voltage and time can also vary from 200 to 1000 VDC or higher and 10 to 180 seconds or longer depending on the desired coating thickness. These bath formulations were, however, found to be particularly satisfactory for depositing glass/ceramic particles on various metallic substrates such as low carbon steel, alloy steels, stainless steels, aluminum, and even chromeplated steel substrates. The baths yielded a uniform, dense and consistent deposit over a two months test period.

Ethylene glycol appears to aid in obtaining a uniform, smooth coating deposit and the binder seems to help improve the deposit strength and minimize flow marks during the sample withdrawal from the bath. The coated substrate required no special drying except placing in a vented hood and was ready to be fired in about 15 minutes because the solvents evaporated rapidly. No adverse effect due to the binders was observed on the fired appearance of samples.

For the low carbon steel substrates which had been pickled and nickel flashed, a simple copper activation dipping was necessary, similar to that for the aqueous deposition systems. As noted hereinbefore, low carbon steel has long been regarded as the most economical and suitable core metal for the porcelain enamel coated metal substrates. The low carbon steel provides good enamel-metal bonding for the conventional PEMS and has a thermal conductivity better than that of any alloy steel. One of the major difficulties experienced with the low carbon steel has been a tendency to develop enamel cracks on edges or more specifically on corners.

One of the main causes of the edge/corner chipping problem is thought to be too great an expansion of the core metal compared to the coating materials. Since the stresses on the edges and corners of the panel are opposite to those on a flat panel, the edge/corner chippings are thought to be closely related to the stress level on the edges and corners produced by the expansion difference. The edge/corner chipping problem is particularly troublesome where the substrates are to be repeatedly refired at the high temperatures.

Since the thermal expansion of the glasses of the present invention (106–117×10$^{-7}$ in/in/° C.) have been already deemed to have been optimized, other metals with an expansion lower than that of low carbons steel (146.5×10$^{-7}$ in/in/° C.) have been examined. The 400-series stainless steels have been found to have an adequate range of thermal expansion of around 125×10$^{-7}$ in/in/° C. and a good heat resisting property. The 409 stainless steel (SS-409) has been found to be a particularly good material, having an expansion of 127×10$^{-7}$ in/in/° C.

Lack of enamel/metal bonding has been a major difficulty with stainless steel type substrates heretofore used for porcelain enamel coating application. A new preparation process has been developed which achieves a good enamel/metal bonding and overcomes such prior problems. As already noted, the conventional metal preparation techniques, such as acid pickling and nickel flash, are not applicable to the stainless steel substrates because these metals are chemically and electrochemically very inert so that little or no reaction will take place in acid or nickel solutions. Other prior art techniques such as sandblasting have also been found unsatisfactory for use in the present application. Although the sandblasting is often considered the best present method for preparing stainless steel, it is costly and deforms (warps) the light gauge sheet steel commonly used for the enamel substrates.

The novel treatment process of the present invention utilizes a metallic film of molybdenum electrochemically plated onto the stainless steel substrate typically under the following electroplating conditions.

| Bath | 5 wt % ammonium heptamolybdate tetrahydrate solution, (NH$_4$)$_6$Mo$_7$O$_{24}$·4H$_2$O |
|---|---|
| Cathode | Workpiece (2″ × 2″) |
| Anode | Inert material (stainless steel, 2″ × 3″) |
| Plating Voltage | 2.0–5.0 volts DC |
| Plating Current | 0.2–3.0 amp per 2″ × 2″ (7 to 110 amp/sq. ft.) |
| Plating Time | 5–60 seconds |

A uniform film of molybdenum was plated on to a SS-409 cathode. The piece was rinsed, dried, and fired in air at 880° C. for 10 to 20 minutes. This firing step is important since an adhesion promoting layer is formed in this stage, presumably by the oxidation of thin molybdenum film and the diffusion of molybdenum into the steel. Particularly good enamel bonding was obtained with the enamel of Example 7. Higher firing temperatures (up to 980° C.) or longer firing times (up to 30 minutes) for this heat treatment procedure did not appear to significantly affect the enamel bonding characteristics. In general, the heat treatment should comprise heating to a temperature of at least 800° C. and for at least 5 minutes.

The preferred PEMS of the present invention comprises a stainless steel substrate having a coating of molybdenum electroplated and heat treated on at least one surface thereof, and a porcelain enamel coating on said molybdenum coated surface, said enamel having a composition within the oxide ranges set forth in Table I.

Novel PEMS were fabricated by using the enamel of Example 7 and SS-409 metal core. Samples of such PEMS were then examined and provided the data described below.

1. Refire (enamel softening) temperature : >900° C.
2. Smooth surface, off white color
3. Good enamel to metal bonding
4. Good edge coverage, no edge/corner chipping even after ten 900° C. refires.
5. Thermal Expansion (×10$^{-7}$in/in/° C.

| Temp. Range | Core Metal (SS-409) | Enamel No. 7 | Low Carbon Steel |
|---|---|---|---|
| 20–300° C. | 127.3 | 108.5 | 140.0 |
| 20–500 | 127.2 | 115.8 | 146.5 |
| 20–800 | 130.8 | 123.3 | 148.0 |
| 20–900 | 133.5 | 124.0 | — |

*Close expansion matches between the core metal and enamel should mean a low level of stresses (tension/compression) or a good edge/corner chipping resistance 6. Electrical Resistivity

| Below 200° C. | Higher than 10$^{15}$ ohm-cm |
|---|---|
| At 250 | 2.0 × 10$^{14}$ |
| At 300 | 1.6 × 10$^{13}$ |
| Dielectric Constant (25° C.) | 8.5 (1 KHz) |
| | 8.2 (1 MHz) |
| Dissipation Factor (25° C.) | 0.005 (1 KHz) |
| | 0.005 (1 MHz) |

7. Dielectric Strength (5 mils coating) : >3.0 Kv

| Sample No. | Thickness | Breakdown Voltage |
|---|---|---|
| #1 | 5.0 mils | 4.5 Kv |
| #2 | 5.0 | No breakdown at 6.0 Kv |
| #3 | 5.0 | 3.0 |
| #4 | 5.0 | 5.5 |
| #5 | 6.0 | No breakdown at 6.0 Kv |
| #6 | 6.0 | No breakdown at 6.0 Kv |
| #7 | 5.5 | No breakdown at 6.0 Kv |
| #8 | 5.5 | No breakdown at 6.0 Kv |

*These properties, 1 to 7, are considered superior to those of known enamels and substrates.

It will, of course, be clearly understood that the novel enamel compositions of the present invention have utility in the fabrication of PEMS using conventional electrophoresis application techniques and conventional low carbon steel or other metal substrates. Likewise, the novel bath of the present invention has equal utility with other devitrified glass compositions outside the scope of Tables I and II set forth hereinbefore and likewise, can be employed in coating conventional as well as stainless steel metal substrates. Finally, the specially treated stainless steel substrates of the present invention can be used as substrates for conventional devitrified glass compositions applied from conventional electrophoresis plating baths or by any other application techniques.

It will therefore be understood that the foregoing specific examples are presented by way of illustration and not by way of limitation, and that a wide variety of changes, alterations, and substitutions can be made in the formulations, baths, materials and processes described hereinbefore without departing from the scope of the present invention.

We claim:

1. A novel porcelain enamel having, in weight percent, the following composition:

| | |
|---|---|
| $SiO_2$ | 9–16% |
| $B_2O_3$ | 20–25% |
| $MoO_3$ | 2–10% |
| MgO | 30–40% |
| BaO | 16–22% |
| ZnO | 5–14% |
| $SnO_2$ | 0–4%. |

2. The porcelain enamel of claim 1 wherein said enamel has the following composition:

| | |
|---|---|
| $SiO_2$ | 11.0–15.0% |
| $B_2O_3$ | 21.0–24.0% |
| $MoO_3$ | 2.0–8.0% |
| MgO | 30.0–36.0% |
| BaO | 16.0–22.0% |
| ZnO | 6.0–12.0% |
| $SnO_2$ | 0–4.0%. |

3. The porcelain enamel of claim 1 wherein said enamel has the following composition:

| | |
|---|---|
| BaO | 17.89 |
| MgO | 32.62 |
| ZnO | 10.59 |
| $SiO_2$ | 14.02 |
| $B_2O_3$ | 22.87 |
| $MoO_3$ | 2.01. |

4. The porcelain enamel of claim 1 wherein said enamel has the following composition:

| | |
|---|---|
| BaO | 17.55 |
| MgO | 32.02 |
| ZnO | 10.38 |
| $SiO_2$ | 13.75 |
| $B_2O_3$ | 22.45 |
| $MoO_3$ | 3.85. |

5. The porcelain enamel of claim 1 wherein said enamel has the following composition:

| | |
|---|---|
| BaO | 16.90 |
| MgO | 30.83 |
| ZnO | 10.00 |
| $SiO_2$ | 13.24 |
| $B_2O_3$ | 21.62 |
| $MoO_3$ | 7.41. |

6. The porcelain enamel of claim 1 wherein said enamel has the following composition:

| | |
|---|---|
| BaO | 18.13 |
| MgO | 33.65 |
| ZnO | 10.38 |
| $SiO_2$ | 11.54 |
| $B_2O_3$ | 22.45 |
| $MoO_3$ | 3.85. |

7. The porcelain enamel of claim 1 wherein said enamel has the following composition:

| | |
|---|---|
| BaO | 21.00 |
| MgO | 33.00 |
| ZnO | 7.00 |
| $SiO_2$ | 12.00 |
| $B_2O_3$ | 23.00 |
| $MoO_3$ | 4.00. |

8. The porcelain enamel of claim 1 wherein said enamel has the following composition:

| | |
|---|---|
| BaO | 18.01 |
| MgO | 33.14 |
| ZnO | 10.48 |
| $SiO_2$ | 12.78 |
| $B_2O_3$ | 22.66 |
| $MoO_3$ | 2.93. |

9. The porcelain enamel of claim 1 wherein said enamel has the following composition:

| | |
|---|---|
| BaO | 21.00 |
| MgO | 33.00 |
| ZnO | 7.00 |
| $SiO_2$ | 12.00 |
| $B_2O_3$ | 23.00 |
| $MoO_3$ | 3.60 |
| $SnO_2$ | 0.40. |

10. The porcelain enamel of claim 7 wherein said enamel is prepared by heating to a temperature in excess of its melting point, an admixture containing in parts by weight

| | |
|---|---|
| Barium Carbonate, $BaCO_3$ | 654.4 |
| Calcined Magnesia, MgO | 829.2 |
| Zinc Oxide, ZnO | 168.0 |
| Quartz Powder, $SiO_2$ | 288.0 |
| Anhydrous Boric Acid, $B_2O_3$ | 560.4 |
| Molybdenum Trioxide, $MoO_3$ | 96.0 |
| TOTAL | 2596.0. |

11. The porcelain enamel of claim 1 wherein said enamel contains more than 90 volume percent of crystalline material.

12. The porcelain enamel of claim 1 wherein said enamel is substantially free from sodium oxide.

* * * * *